United States Patent [19]

Liu et al.

[11] Patent Number: 5,258,942
[45] Date of Patent: Nov. 2, 1993

[54] BALANCED TWO-LEVEL DELAY PROPAGATION ALL ONE DETECTOR COMPILER

[75] Inventors: Chun-Ling Liu, Milpitas; Lin Yang, Fremont, both of Calif.

[73] Assignee: VLSI Technology, Inc., San Jose, Calif.

[21] Appl. No.: 854,923

[22] Filed: Mar. 20, 1992

[51] Int. Cl.$^5$ .................................................. G06F 7/38
[52] U.S. Cl. ............................ 364/736.5; 364/715.09
[58] Field of Search ........... 364/736.5, 715.01, 715.09, 364/715.1

[56] References Cited

U.S. PATENT DOCUMENTS

| | | | |
|---|---|---|---|
| 3,983,382 | 9/1976 | Weinberger | 364/736.5 |
| 4,815,019 | 3/1989 | Bosshart | 364/736.5 |
| 5,091,874 | 2/1992 | Watanabe et al. | 364/715.1 |
| 5,148,057 | 9/1992 | Kitora | 364/715.01 |

Primary Examiner—David H. Malzahn
Attorney, Agent, or Firm—Burns, Doane, Swecker & Mathis

[57] ABSTRACT

An apparatus for detecting a binary word each of the bits of which has the same binary value includes a plurality of logic groups, different ones of which receive different numbers of bits of the binary word. Each of the logic groups generates an output signal that is asserted if each of the number of bits received by the logic group has the same binary value. Carry ripple circuits series connected to form a carry ripple chain each receive an output signal from one of the logic groups. The carry ripple circuits also receive a carry ripple output signal from a previous carry ripple circuit and produce a carry ripple output signal for a succeeding carry ripple circuit. The carry ripple output signal is asserted when the output signal from the logic group is asserted and the carry ripple output signal from the previous carry ripple circuit is asserted.

8 Claims, 2 Drawing Sheets

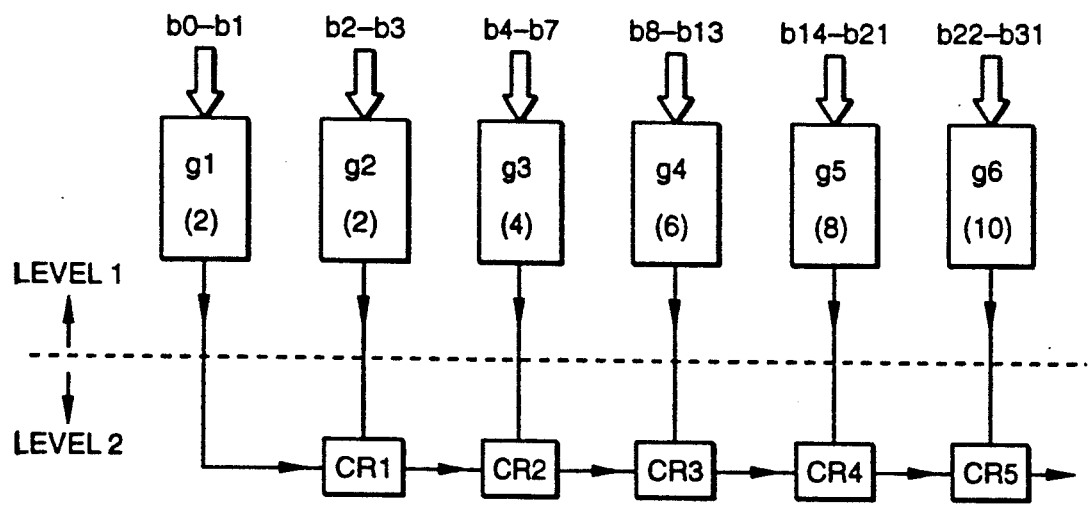
FIG._1
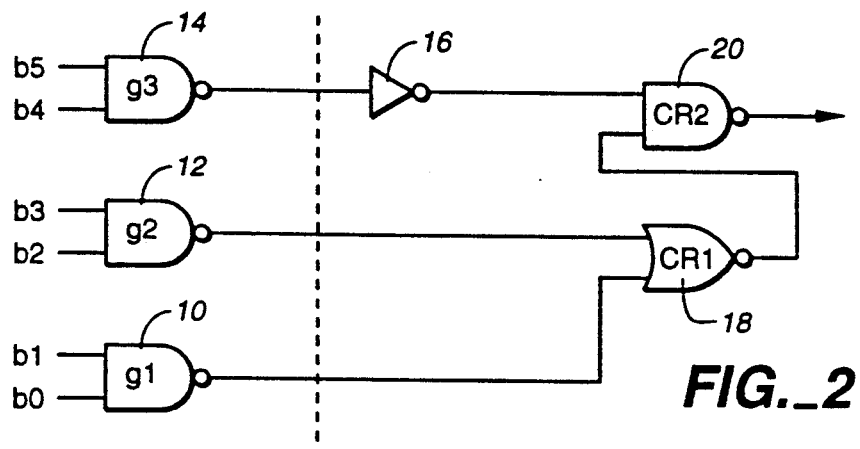
FIG._2
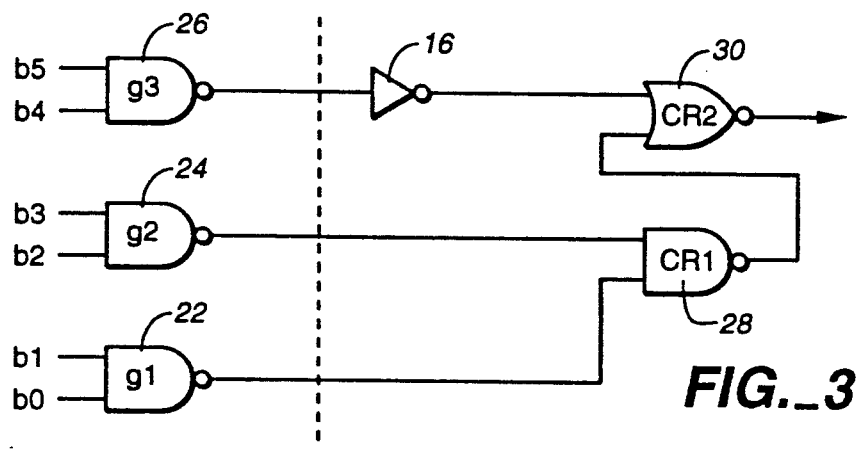
FIG._3

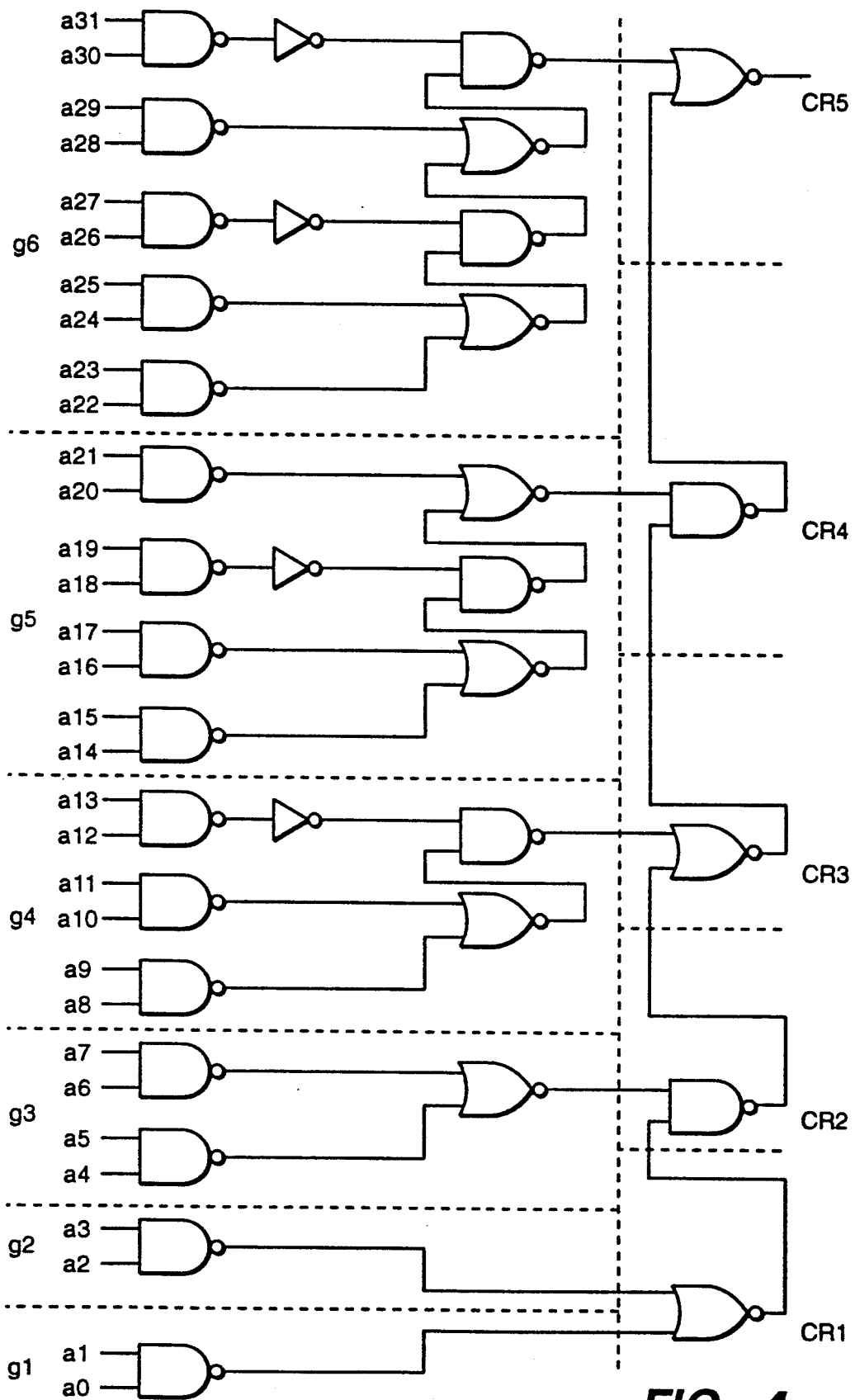
FIG._4

BALANCED TWO-LEVEL DELAY PROPAGATION ALL ONE DETECTOR COMPILER

BACKGROUND OF THE INVENTION

1. Field of the Invention

The present invention relates to detectors for detecting the occurrence of all ones or all zeros in a binary word, and particularly to such a detector that may be easily compiled using a chip layout design program, or silicon compiler.

2. State of the Art

Detectors of the foregoing type are widely used in microprocessors and the like, for example to detect overflow of an accumulator or to detect the occurrence of a zero value in the accumulator. All ones detectors and all zeros detectors may together be referred to as "all-bits-equal" detectors. Circuits for implementing all-bits-equal detectors are known in the art. Such circuits have generally not been readily compilable using compiler programs. For compilability, such a detector circuit should be fast, dense and regular in its layout. The present invention provides a detector circuit that exhibits each of these features.

SUMMARY OF THE INVENTION

According to the present invention, an apparatus for detecting a binary word each of the bits of which has the same binary value includes a plurality of logic groups, different ones of which receive different numbers of bits of the binary word. Each of the logic groups generates an output signal that is asserted if each of the number of bits received by the logic group has the same binary value. Carry ripple circuits series connected to form a carry ripple chain each receive an output signal from one of the logic groups. The carry ripple circuits also receive a carry ripple output signal from a previous carry ripple circuit and produce a carry ripple output signal for a succeeding carry ripple circuit. The carry ripple output signal is asserted when the output signal from the logic group is asserted and the carry ripple output signal from the previous carry ripple circuit is asserted.

BRIEF DESCRIPTION OF THE DRAWINGS

The present invention can be further understood with reference to the following description in conjunction with the appended drawings. In the drawings:

FIG. 1 is a block diagram of the all-bitsequal detector of the present invention;

FIG. 2 is a logic diagram of a six-bit all ones detector;

FIG. 3 is a logic diagram of a six-bit all zeros detector; and

FIG. 4 is a logic diagram of a 32-bit all ones detector.

DETAILED DESCRIPTION OF THE PREFERRED EMBODIMENTS

Referring now to FIG. 1, the present all-bits-equal detector is arranged according to an architecture in which a number of similarly-constituted logic groups g1–g6 at a first level (level I) provide output signals to respective stages (CR1–CR5) of a carry ripple chain at a second level (level 2). The logic groups receive as input signals the bits of the binary word to be tested by the all-bits-equal detector. The logic groups are variable length in that different logic groups receive different numbers of bits of the binary word. The term "group length" refers to the number of bits received by a particular logic group and is indicated in parentheses inside each logic group in FIG. 1. The first and second logic groups g1 and g2 each have a group length of 2, after which the group length increases by two for each logic group. The logic groups consist of all ones or all zeros generators, i.e., logic circuits for generating an output signal that is asserted if all of the bits input to the logic group are equal. The output signals of the logic groups are input to respective stages of the carry ripple chain on level 2.

The carry ripple stages CR1–CR5 on level 2 are similarly-constituted and are series connected to form a carry ripple chain. Each carry ripple stage receives a carry ripple output signal from a previous carry ripple stage and produces a carry ripple output signal for a succeeding carry ripple stage in accordance with the output signal of its associated logic group. In the case of the first carry ripple stage CR1, since it is not preceded by any other carry ripple stage, it receives as a carry ripple input signal the output signal of the first logic group g1. In the case of the last carry ripple stage, its carry ripple output signal acts as the output signal of the entire detector.

A six-bit all ones detector may be realized according to the logic diagram of FIG. 2. Logic groups g1, g2 and g3 in FIG. 1 are realized by NAND gates 10, 12 and 14, respectively. Carry ripple stages CR1 and CR2 of FIG. 1 are realized by NOR gate 18 and NAND gate 20, respectively. In general, for an all ones detector, the first carry ripple stage will be realized by a NOR gate, the second carry ripple stage will be realized by a NAND gate, the third carry ripple stage will be realized by a NOR gate, etc. Whereas in FIG. 1, logic group g3 has a group length two greater than the group length of logic group g2, in the six-bit all ones detector of FIG. 2, logic group 3 has a group length of 2, the same as logic groups g1 and g2. This variance from the pattern set forth in FIG. 1 necessitates the use of an additional inverter 16 as part of the second carry ripple stage CR2.

In operation of the six-bit all ones detector of FIG. 2, if bits b0–b3 are all ones, then NAND gates 10 and 12 both output zeros and NOR gate 18 outputs a 1. If bits b4 and b5 are both ones, then NAND gate 14 outputs a zero which is then inverted to a 1 by the inverter 16. Both of the inputs to the NAND gate 20 are therefore ones, such that a zero output is produced indicative of an all ones condition.

As shown in FIG. 3, a six-bit all zeros detector is arrived at by simply changing NAND gates to NOR gates and NOR gates to NAND gates in the circuit of FIG. 2. In operation if bits b0–b3 are all zeros, then NOR gates 22 and 24 both output ones and NAND gate 28 outputs a zero. If bits b4 and b5 are both zeros, then NOR gate 26 outputs a 1 which is then inverted to a zero by the inverter 16. Both of the inputs to the NOR gate 30 are therefore zeros, such that a 1 output is produced indicative of an all zeros condition.

The logic diagram for a full 32-bit all ones detector is shown in FIG. 4. Several features of the circuit of FIG. 4 contribute to its being readily compilable. First, none of the inputs experiences any more than six gate delays. Some of the inputs experience only four gate delays. As a result, the circuit is very fast. Also, the circuit is very dense, connections between the various logic elements requiring only a minimum of space. Finally, the circuit is very regular. All of the inputs run parallel to one another. Furthermore, for many of the logic groups, the logic group is identical to an all ones detector of a number of bits equal to the group length. For example, logic group g4 having a group length of six is identical to the six bit all ones detector of FIG. 2.

As with FIG. 2, an equivalent all zeros detector may be arrived at by replacing NAND gates with NOR gates and NOR gates with NAND gates.

The foregoing has described the principals, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of the present invention as defined by the following claims.

What is claimed is:

1. An apparatus for detecting a binary word each of the bits of which has the same binary value, comprising:
    a plurality of logic group means, different ones of the logic group means receiving different number of bits of said binary word, each for generating an output signal that is asserted if each of the number of bits received by the logic group means has said same binary value, at least some of said logic group means comprising interconnected logic gates of the NAND and NOR types, each output signal of each gate of each type being connected to one of an input terminal of a gate of the other type and an inverter connected to an input terminal of a gate of the same type; and
    a plurality of carry ripple means series connected to form a carry ripple chain, each for receiving said output signal from one of said logic group means, receiving a carry ripple output signal from a previous carry ripple means, receiving a carry ripple output signal from a previous carry ripple means, and producing a carry ripple output signal for a succeeding carry ripple means, said carry ripple output signal being asserted when both said output signal is asserted and said carry ripple output signal from said previous carry ripple means is asserted, wherein a first carry ripple means in said carry ripple chain receives said output signal from a first logic group means in place of a carry ripple output signal from a previous carry ripple means and a last carry ripple means in said carry ripple chain produces as said carry ripple output signal a signal indicative of whether each of the bits of said binary word has said same binary value.

2. The apparatus of claim 1 wherein said carry ripple means each comprises one of a NAND gate and a NOR gate.

3. The apparatus of claim 2 wherein adjacent one of said carry ripple means in said carry ripple chain comprise opposite ones of said NAND gate and said NOR gate.

4. The apparatus of claim 3 wherein said same binary value is a binary one.

5. The apparatus of claim 4 wherein said first carry ripple means comprises a NOR gate.

6. The apparatus of claim 3 wherein said sam binary value is a binary zero.

7. The apparatus of claim 6 wherein said first carry ripple means comprises a NAND gate.

8. An apparatus for detecting a binary word each of the bits of which has the same binary value, comprising:
    a plurality of logic group means, different ones of the logic group means receiving different numbers of bits of said binary word, each for generating an output signal that is asserted if each of the number of bits received by the logic group means has said same binary value; and
    a plurality of carry ripple means series connected to form a carry ripple chain, each comprising one of a NAND gate and a NOR gate, for receiving said output signal from one of said logic group means, receiving a carry ripple output signal from a previous carry ripple means, and producing a carry ripple output signal for a succeeding carry ripple means, said carry ripple output signal being asserted when both said output signal is asserted and said carry ripple output signal from said previous carry ripple means is asserted, wherein a first carry ripple means in said carry ripple chain receives said output signal from a first logic group means in place of a carry ripple output signal from a previous carry ripple means, a last carry ripple means in said carry ripple chain produces as said carry ripple output signal a signal indicative of whether each of the bits of said binary word has said same binary value, and adjacent ones of said carry ripple means in said carry ripple chain comprise opposite ones of said NAND gate and said NOR gate.

* * * * *